(12) United States Patent
Xiao et al.

(10) Patent No.: US 12,349,332 B2
(45) Date of Patent: Jul. 1, 2025

(54) MANUFACTURING METHOD OF SEMICONDUCTOR STRUCTURE AND SEMICONDUCTOR STRUCTURE

(71) Applicants: CHANGXIN MEMORY TECHNOLOGIES, INC., Hefei (CN); BEIJING SUPERSTRING ACADEMY OF MEMORY TECHNOLOGY, Beijing (CN)

(72) Inventors: Deyuan Xiao, Hefei (CN); Yong Yu, Hefei (CN); Guangsu Shao, Hefei (CN)

(73) Assignees: CHANGXIN MEMORY TECHNOLOGIES, INC., Hefei (CN); BEIJING SUPERSTRING ACADEMY OF MEMORY TECHNOLOGY, Beijing (CN)

( * ) Notice: Subject to any disclaimer, the term of this patent is extended or adjusted under 35 U.S.C. 154(b) by 496 days.

(21) Appl. No.: 17/817,671

(22) Filed: Aug. 5, 2022

(65) Prior Publication Data

US 2023/0171940 A1 Jun. 1, 2023

(30) Foreign Application Priority Data

Nov. 30, 2021 (CN) .......................... 202111441189.4

(51) Int. Cl.
H10B 12/00 (2023.01)
(52) U.S. Cl.
CPC ........... H10B 12/05 (2023.02); H10B 12/315 (2023.02); H10B 12/482 (2023.02)
(58) Field of Classification Search
CPC .... H10B 12/05; H10B 12/315; H10B 12/482; H10B 12/053; H10B 12/30; H10B 12/395; H10B 12/02; H10B 12/0383
See application file for complete search history.

(56) References Cited

U.S. PATENT DOCUMENTS 9,112,032 B1 8/2015 Liu et al.
9,318,576 B2 4/2016 Park
(Continued)

FOREIGN PATENT DOCUMENTS

CN 104425608 A 3/2015
CN 108389896 A 8/2018
(Continued)

OTHER PUBLICATIONS

First Office Action cited in CN202111444498.7 mailed May 16, 2022, 23 pages.
(Continued)

*Primary Examiner* — Tucker J Wright
(74) *Attorney, Agent, or Firm* — Kilpatrick Townsend & Stockton LLP

(57) ABSTRACT

The present disclosure provides a manufacturing method of a semiconductor structure and a semiconductor structure. The manufacturing method of a semiconductor structure includes: providing a substrate; forming a plurality of silicon pillars arranged in an array on the substrate; pre-processing the silicon pillar, to form an active pillar, where along a first direction, the active pillar includes a first segment, a second segment, and a third segment that are connected sequentially; forming a gate oxide layer on sidewalls of each of the second segment and the third segment; and forming a gate dielectric layer on the gate oxide layer, where along the first direction, the gate dielectric layer is shorter than the gate oxide layer, and a top surface of the gate dielectric layer is flush with that of the third segment.

12 Claims, 12 Drawing Sheets

(56) References Cited

U.S. PATENT DOCUMENTS

| | | | |
|---|---|---|---|
| 2006/0043472 A1 | 3/2006 | Wang et al. | |
| 2007/0082448 A1* | 4/2007 | Kim .................... | H10B 12/053 257/E21.41 |
| 2011/0121396 A1 | 5/2011 | Lee | |
| 2021/0296316 A1 | 9/2021 | Zhu | |

FOREIGN PATENT DOCUMENTS

| | | | |
|---|---|---|---|
| CN | 108807545 | A | 11/2018 |
| CN | 109449158 | A | 3/2019 |
| CN | 109841522 | A | 6/2019 |
| CN | 109979880 | A | 7/2019 |
| CN | 113611671 | A | 11/2021 |

OTHER PUBLICATIONS

International Search Report cited in PCT/CN2022/077639 mailed May 19, 2022, 9 pages.
International Search Report cited in PCT/CN2022/077681 mailed Aug. 9, 2022, 8 pages.

* cited by examiner

US 12,349,332 B2

MANUFACTURING METHOD OF SEMICONDUCTOR STRUCTURE AND SEMICONDUCTOR STRUCTURE

CROSS-REFERENCE TO RELATED APPLICATION

This application claims the priority of Chinese Patent Application No. 202111441189.4, submitted to the Chinese Intellectual Property Office on Nov. 30, 2021, the disclosure of which is incorporated herein in its entirety by reference.

TECHNICAL FIELD

The present disclosure relates to the technical field of semiconductors, and in particular, to a manufacturing method of a semiconductor structure and a semiconductor structure.

BACKGROUND

A dynamic random access memory (DRAM) is a semiconductor memory that randomly writes and reads data at high speed, and is widely used in data storage devices or apparatuses. The DRAM includes a plurality of memory cells disposed repeatedly, and each of the memory cells includes a transistor and a capacitor. The capacitor is connected to a source and a drain of the transistor through a capacitor contact region and a capacitor contact structure. As electronic products are increasingly becoming lighter, thinner, shorter, and smaller, components of the DRAM are also designed toward the trend of high integration, high density, and miniaturization.

With the development of semiconductor processes, a size of a semiconductor device is becoming smaller. Gate-induced drain leakage (GIDL) imposes a great adverse impact on formation of a semiconductor structure, reducing performance and a yield of the semiconductor structure.

SUMMARY

A first aspect of the present disclosure provides a manufacturing method of a semiconductor structure, including
  providing a substrate;
  forming a plurality of silicon pillars on the substrate, where the plurality of silicon pillars are arranged as an array;
  pre-processing the silicon pillar to form an active pillar, where along a first direction, the active pillar includes a first segment, a second segment, and a third segment that are connected sequentially;
  forming a gate oxide layer on sidewalls of each of the second segment and the third segment; and
  forming a gate dielectric layer on the gate oxide layer, where along the first direction, the gate dielectric layer is shorter than the gate oxide layer, and a top surface of the gate dielectric layer is flush with that of the third segment.

A second aspect of the present disclosure provides a semiconductor structure, including:
  a substrate;
  a plurality of active pillars, arranged as an array in the substrate, where the active pillar includes a first segment, a second segment, and a third segment that are connected sequentially along a first direction;
  a gate oxide layer, where the gate oxide layer covers sidewalls of each of the second segment and the third segment; and
  a gate dielectric layer, disposed outside the gate oxide layer, where along the first direction, the gate dielectric layer is shorter than the gate oxide layer, and a top surface of the gate dielectric layer is flush with that of the third segment.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may obtain other accompanying drawings based on these accompanying drawings without creative efforts.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

A DRAM is a semiconductor memory that randomly writes and reads data at a high speed, and is widely used in data storage devices or apparatuses. The DRAM includes a plurality of memory cells disposed repeatedly, and each of the memory cells includes a transistor and a capacitor. The capacitor is connected to a source and a drain of the transistor through a capacitor contact region and a capacitor contact structure. As electronic products are increasingly becoming lighter, thinner, shorter, and smaller, components of the DRAM are also designed toward the trend of high integration, high density, and miniaturization.

In the related art, the transistor can be understood as a current switch structure made of a semiconductor material. A metal gate is disposed between the source and the drain of the transistor, and the metal gate can be used to control on/off of a current between the source and the drain. A gate-all-around (GAA) transistor is made by using a GAA technology. With the development of semiconductor processes, a size of a semiconductor device is becoming smaller. In addition, GIDL occurs in a process of forming a structure of the GAA transistor, reducing performance and a yield of the semiconductor structure.

In order to resolve one of the foregoing technical problems, an exemplary embodiment of the present disclosure provides a manufacturing method of a semiconductor structure. The following describes the manufacturing method of a semiconductor structure with reference to FIGS. 1 to 34.

There are no limits made on the semiconductor structure in the embodiments. The semiconductor structure is described below by using a DRAM as an example, but is not limited thereto in the embodiments. Alternatively, the semiconductor structure in the embodiments may be another structure, for example, a GAA transistor or a vertical gate-all-around (VGAA) transistor.

Figure 1:
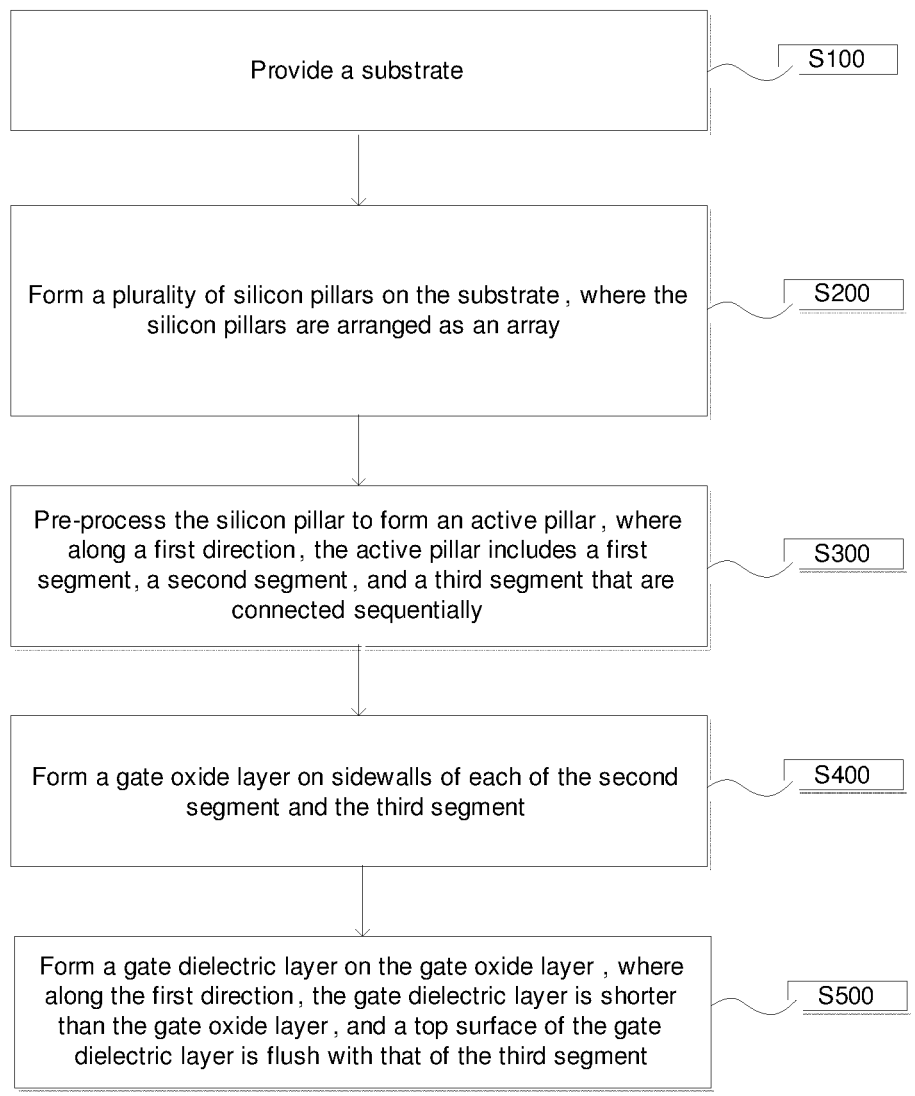
FIG. 1 is a flowchart of a manufacturing method of a semiconductor structure according to an exemplary embodiment.

As shown in FIG. 1, an exemplary embodiment of the present disclosure provides a manufacturing method of a semiconductor structure, including the following steps:

Step S100: Provide a substrate.

Step S200: Form a plurality of silicon pillars on the substrate, where the silicon pillars are arranged as an array.

Step S300: Pre-process the silicon pillar to form an active pillar, where along a first direction, the active pillar includes a first segment, a second segment, and a third segment that are connected sequentially.

Step S400: Form a gate oxide layer on sidewalls of each of the second segment and the third segment.

Step S500: Form a gate dielectric layer on the gate oxide layer, where along the first direction, the gate dielectric layer is shorter than the gate oxide layer, and a top surface of the gate dielectric layer is flush with that of the third segment.

In this embodiment, the gate oxide layer is formed on the sidewalls of each of the second segment and the third segment of the active pillar, and then the gate dielectric layer is formed on the sidewall of the gate oxide layer. The gate dielectric layer is shorter than the gate oxide layer, and the top surface of the gate dielectric layer is flush with that of the third segment, such that two ends of the second segment have different capacitances, to have different potentials, which is beneficial to controlling the turn-off current of the semiconductor structure, and reducing the problems of GIDL current and inter-band tunneling, thereby improving the performance and yield of the semiconductor structure.

According to an exemplary embodiment, this embodiment is a further description of step S100 described above.

Figure 2:
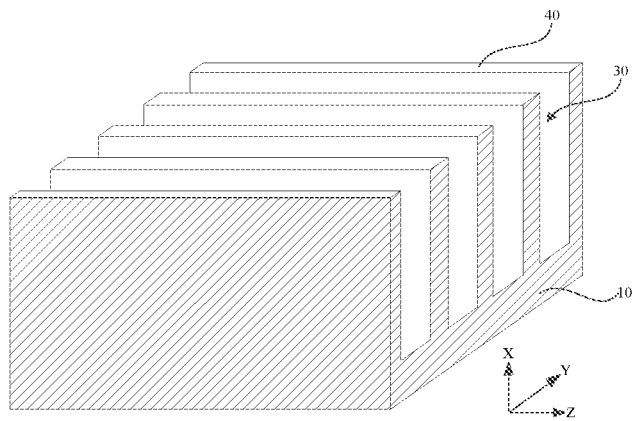
FIG. 2 is a schematic diagram of forming a strip body in the manufacturing method of a semiconductor structure according to an exemplary embodiment.

As shown in FIG. 2, in step S100, the substrate 10 serves as a support member of a DRAM and is configured to support other components provided thereon. The substrate 10 may be made of a semiconductor material. The semiconductor material may be one or more of silicon, germanium, a silicon-germanium compound, and a silicon-carbon compound. In this embodiment, the substrate 10 is made of silicon, to facilitate understanding of a subsequent forming method by those skilled in the art, rather than to constitute a limitation. In an actual application process, an appropriate material of the substrate may be selected as required.

According to an exemplary embodiment, this embodiment is a further description of step S200 described above.

Figure 3:
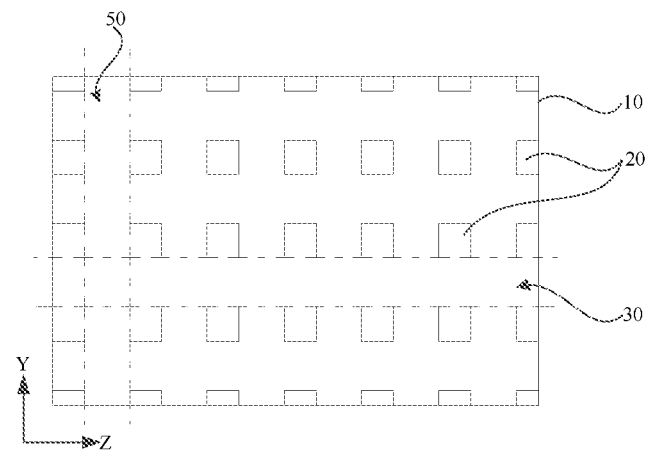
FIG. 3 is a top view of forming a silicon pillar in the manufacturing method of a semiconductor structure according to an exemplary embodiment.

As shown in FIGS. 2 and 3, in step S200, a plurality of silicon pillars 20 are formed on the substrate 10. The plurality of silicon pillars 20 are arranged as an array on the substrate 10. In other words, the silicon pillars 20 may be arranged in a plurality of rows and a plurality of columns.

In this embodiment, with reference to FIG. 2, description in this embodiment is made by using the orientation shown in the figure as an example, and the third direction Z is an extension direction parallel to the front side surface of the substrate 10. The second direction Y intersects the third direction Z on a same horizontal plane, where the second direction Y may intersect the third direction Z at a predetermined angle. For example, the second direction Y is perpendicular to the third direction Z.

In some embodiments, the silicon pillars 20 may be formed on the substrate 10 by using the following method.

At first, a plurality of bit line isolation trenches 30 are formed in the substrate 10, and disposed at intervals along a second direction Y. With reference to FIG. 2, using an orientation shown in the figure as an example, the second direction Y is an extension direction perpendicular to a front side surface of the substrate 10. The substrate 10 between adjacent bit line isolation trenches 30 forms a strip body 40.

In a process of forming the bit line isolation trench 30 on the substrate 10, a mask layer with a mask pattern may be formed on the substrate 10, and then, along an extension direction from the top surface of the substrate 10 to the bottom surface of the substrate 10, a part of the substrate 10 is removed based on the mask pattern to form the plurality of bit line isolation trenches 30 disposed at intervals along the second direction Y.

Then, with reference to FIG. 3, a plurality of word line isolation trenches 50 are formed in the substrate 10. The plurality of word line isolation trenches 50 are disposed at intervals along a third direction Z. The strip body 40 is divided into the plurality of silicon pillars 20 by the word line isolation trenches 50 disposed along the third direction Z. In this embodiment, along the first direction X, the word line isolation trench 50 is shallower than the bit line isolation trench 30.

In a process of forming the word line isolation trench 50 on the substrate 10, a mask layer with a mask pattern may be formed on the substrate 10, and along the extension direction from the top surface of the substrate 10 to the bottom surface of the substrate 10, a part of the substrate 10 is removed based on the mask pattern to form the plurality of word line isolation trenches 50 disposed at intervals along the third direction Z.

In this embodiment, the bit line isolation trenches 30 arranged at intervals along the second direction Y and the plurality of word line isolation trenches 50 arranged at intervals along the third direction Z are formed on the substrate 10. The substrate 10 between the adjacent bit line isolation structures 30 and between the adjacent word line isolation trenches 50 forms the silicon pillar 20. The formation process of the silicon pillar 20 is simple and easy to control and operate. In an example, the second direction Y is perpendicular to the third direction Z, such that the silicon pillars 20 arranged in an array are formed on the substrate 10. A plane perpendicular to the first direction X is taken as a cross section, and a cross-sectional shape of the silicon pillar 20 includes a square.

It should be noted that, in some embodiments, the silicon pillar 20 may alternatively be formed on the top surface of the substrate 10 by using a silicon epitaxial growth process, or by depositing a plurality of functional layers on the top surface of the substrate 10, and then some of the functional layers are removed through etching, such that the silicon pillars 20 arranged in the plurality of rows and plurality of columns are formed on the substrate 10.

According to an exemplary embodiment, this embodiment is a further description of step S300 described above.

Figure 4:
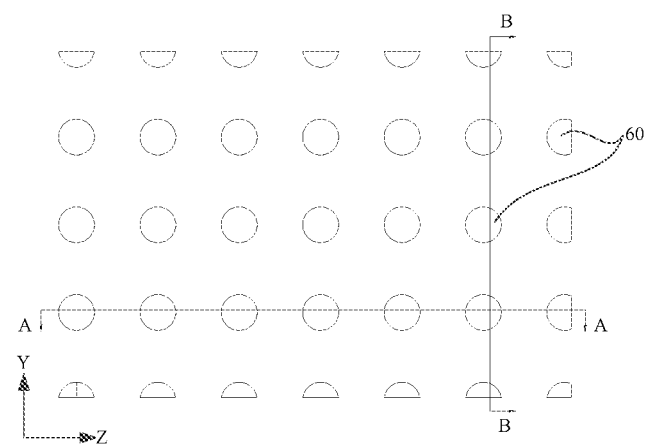
FIG. 4 is a top view of forming an active pillar in the manufacturing method of a semiconductor structure according to an exemplary embodiment.

In step S300, as shown in FIG. 4, the silicon pillars 20 are pre-processed to form the active pillars 60. That is, the silicon pillar 20 is etched or cleaned after the oxidization processing, such that the silicon pillar 20 forms the active pillar 60. Edges and corners of the silicon pillar 20 are passivated through the oxidation processing, such that the cross-sectional shape of the silicon pillar 20 changes from the square to a circle. The cross-sectional shape of the active pillar 60 may further include an ellipse.

It should be noted that in some embodiments, the oxidation processing includes thermal oxidation or steam oxidation. In the oxidation processing, the silicon pillar 20 is exposed to the outside. Through thermal oxidation or steam oxidation, an oxide layer, such as silicon oxide, is formed on a surface of the silicon pillar 20, and then the oxide layer may be removed through etching or cleaning, to passivate the edges and the corners of the silicon pillar 20.

After the silicon pillar 20 is oxidized, ions are implanted into the silicon pillar 20 with a circular cross section to form the active pillar 60. For example, ion implantation energy and a type of implanted doped ions may be controlled three times, to sequentially a first part at the bottom of the silicon pillar 20, the second part in the middle of the silicon pillar 20, and the third part at the top of the silicon pillar 20.

The first part and the third part of the silicon pillar 20 may be implanted with the same type of ions, which, for example, may include N-type ions. The second part and the first or third part are implanted with different ions. For example, the ions doped into the second part may include P-type ions.

It should be noted that the first part of the silicon pillar 20 may form the first segment 601 of the active pillar 60, the second part of the silicon pillar 20 may form the second segment 602 of the active pillar 60, and the third part of the silicon pillar 20 may form the third segment 603 of the active pillar 60.

As an example, the first segment 601 may serve as one of a source region or a drain region. The second segment 602 may serve as a channel region. The third segment 603 may serve the other of a source region or a drain region. For example, in this embodiment, the first segment 601 serves as the drain region, and the third segment 603 serves as the source region.

In this embodiment, the edges and the corners of the silicon pillar 20 are passivated through the oxidation processing, which can subsequently improve an adhesion capability of the active pillar 60, such that the subsequently formed functional layers such as a dielectric layer, a word line, and a bit line can be well connected to the active pillar 60, thereby improving performance and a yield of the semiconductor structure.

Figure 5:
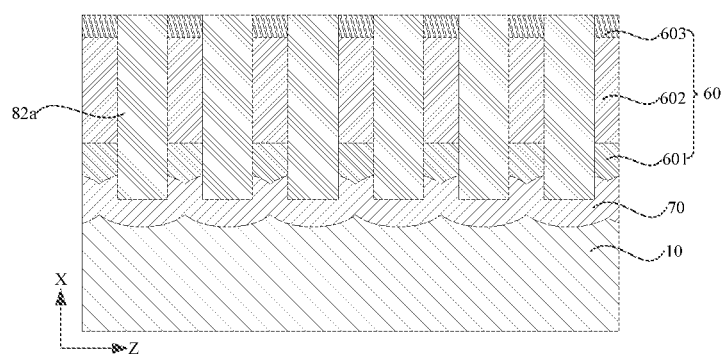
FIG. 5 is a sectional view of forming a bit line and a second initial isolation layer along a direction A-A in FIG. 4.
Figure 6:
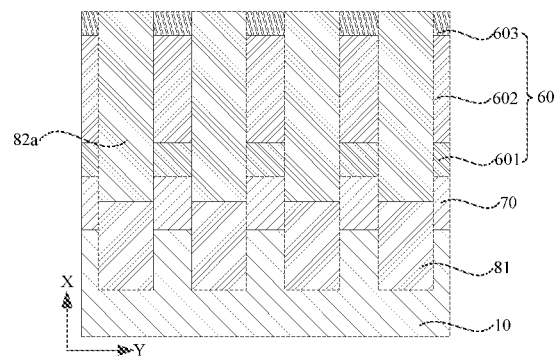
FIG. 6 is a sectional view of forming the bit line and the second initial isolation layer along a direction B-B in FIG. 4.

As shown in FIGS. 5 and 6, after the active pillars 60 are formed, the bit lines 70 are formed in the substrate 10.

In some embodiments, the bit line 70 may be formed by using the following method.

With reference to FIG. 6, a first isolation layer 81 is formed in the bit line isolation trench 30 by using the atomic layer deposition process, the physical vapor deposition process, or the chemical vapor deposition process. In some examples, a first initial isolation layer (not shown in the figure) may be formed in the bit line isolation trench 30 first, and the top surface of the first initial isolation layer is flush with that of the silicon pillar 20. Along the first direction, a part of the first initial isolation layer is removed through etching, such that the top surface of the retained first initial isolation layer is flush with the bottom surface of the word line isolation trench 50. The retained first initial isolation layer forms a first isolation layer 81. A material of the first isolation layer 81 includes, but is not limited to, silicon nitride, silicon dioxide, or silicon oxynitride.

Then, ions are implanted into the word line isolation trenches 50 to form a plurality of bit lines 70 on the bottom surfaces of the first segments 601. The plurality of bit lines 70 are arranged at intervals along the second direction Y.

In some embodiments, cobalt (Co), a nickel platinum (NiPt) alloy, or the like may be implanted into the bottom of the word line isolation trench 50 by using the ion implantation process, and the Co or NiPt alloy reacts with the substrate 10 to form cobalt silicide (CoSi) or platinum nickel silicide (PtNiSi). After annealing, the CoSi or the PtNiSi diffuses to a bottom surface of the active pillar 20 in the substrate 10 to form one bit line 70. The bit lines 70 may be connected to first segments of a plurality of subsequently formed active pillars, along the third direction Z, in a same straight line.

The bit line forming method in this embodiment is simple and easy to control and operate. It should be noted that the bit line may be connected to the drain of the subsequently formed active pillar. In a transistor, a gate is connected to a word line, and a source is connected to a capacitor structure. The voltage signal on the word line is transmitted to the gate, such that the transistor is controlled to turn on or off, and data information stored in the capacitor structure is read through the bit line, or data information is written into the capacitor structure through the bit line for storage.

As shown in FIGS. 5 to 8, after the active pillars 60 are formed, a plurality of bit line isolation structures 80 are formed in the substrate 10 to insulate adjacent bit lines 70. The bit line isolation structures 80 are disposed at intervals along the second direction Y.

In some embodiments, the bit line isolation structure 80 may be formed by using the following method.

With reference to FIGS. 5 and 6, a second initial isolation layer 82*a* is formed on the top surface of the first isolation layer 81 and in the word line isolation trench 50 through the atomic layer deposition process, the physical vapor deposition process, or the chemical vapor deposition process.

Figure 7:
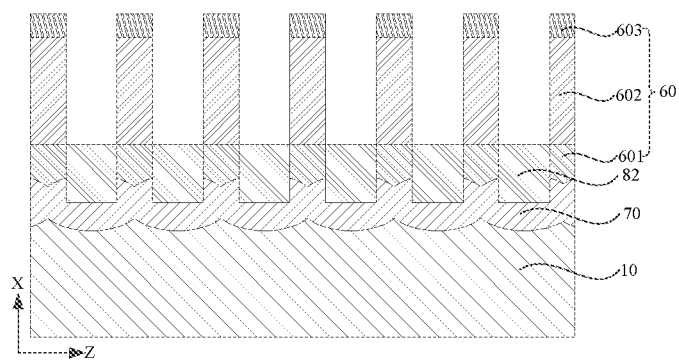
FIG. 7 is a schematic diagram of forming a second isolation layer along a direction Z in the manufacturing method of a semiconductor structure according to an exemplary embodiment.
Figure 8:
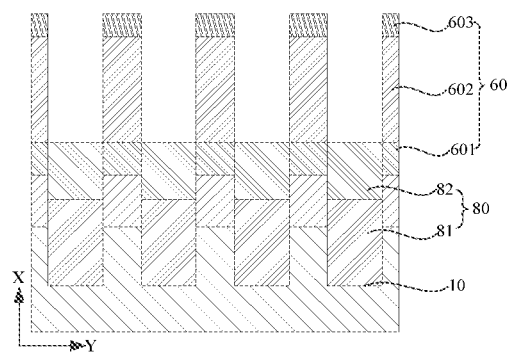
FIG. 8 is a schematic diagram of forming a bit line isolation structure along a direction Y in the manufacturing method of a semiconductor structure according to an exemplary embodiment.
Figure 9:
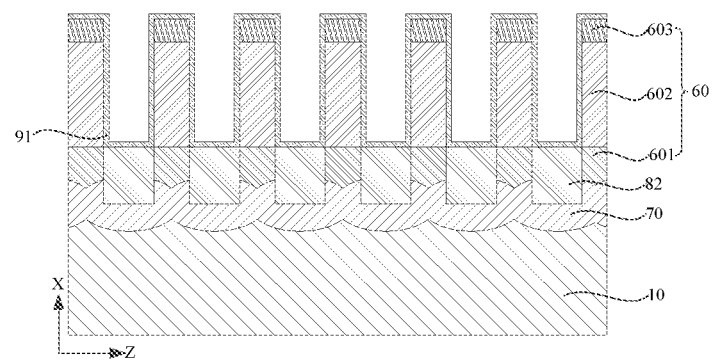
FIG. 9 is a schematic diagram of forming an initial gate oxide layer along the direction Z in the manufacturing method of a semiconductor structure according to an exemplary embodiment.
Figure 10:
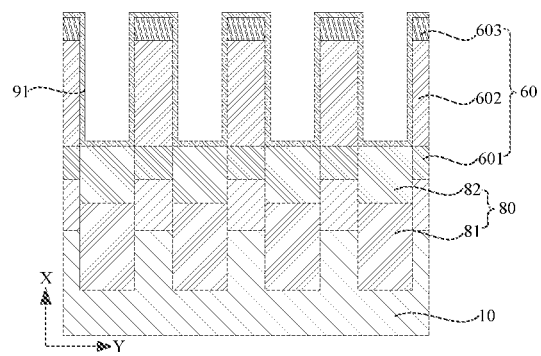
FIG. 10 is a schematic diagram of forming the initial gate oxide layer along the direction Y in the manufacturing method of a semiconductor structure according to an exemplary embodiment.
Figure 11:
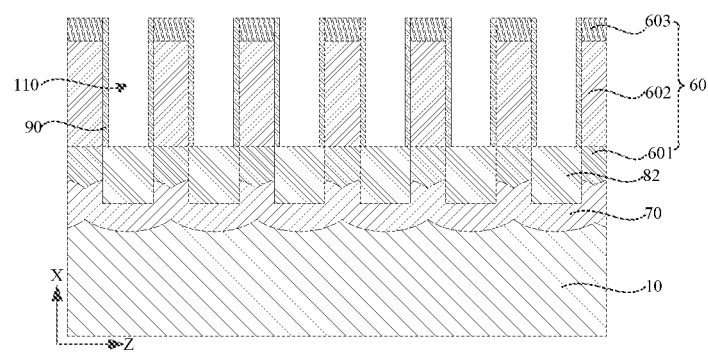
FIG. 11 is a schematic diagram of forming a gate oxide layer along the direction Z in the manufacturing method of a semiconductor structure according to an exemplary embodiment.

With reference to FIGS. 7 and 8, along the first direction X, a part of the second initial isolation layer 82*a* is removed through etching. The etching endpoint of the second initial isolation layer 82*a* is located at a conjunction between the first segment 601 and the second segment 602. The retained second initial isolation layer 82*a* forms the second isolation layer 82, that is, the top surface of the second isolation layer 82 is flush with that of the first segment 601.

A material of the second isolation layer 82 may include, but is not limited to, silicon nitride, silicon dioxide, or silicon oxynitride. The first isolation layer 81 and the second isolation layer 82 may be made of a same material or different materials. In some embodiments, the second isolation layer 82 and the first isolation layer 81 are made of a same material, to shorten the deposition process of the bit line isolation structure 80.

With reference to FIG. 8, along the first direction X, the first isolation layer 81 and the second isolation layer 82 located in the bit line isolation trench 30 form the bit line isolation structure 80.

According to an exemplary embodiment, this embodiment is a further description of step S400 described above.

In step S400, as shown in FIGS. 9 to 12, the gate oxide layer 90 is formed on the sidewalls of each of the second segment 602 and the third segment 603 of the active pillar 60.

The gate oxide layer 90 may be formed by using the following method.

After the bit line isolation structure 80 is formed, the second segment 602 and the third segment 603 of the active pillar 60 are exposed outside. Then, through the atomic layer deposition process, an initial gate oxide layer 91 is formed on the active pillar 60 exposed outside. The initial gate oxide layer 91 covers a sidewall of the second segment 602, a sidewall and a top surface of the third segment 603 of the active pillar 60, and a top surface of the second isolation layer 82.

Then, the initial gate oxide layer 91 on the top surface of the second isolation layer 82 is removed through etching along the first direction X. The retained initial gate oxide layer 91 forms the gate oxide layer 90.

The gate oxide layer 90 formed by using the atomic layer deposition process can effectively isolate and protect the second segment 602 of the active pillar 60 when the gate oxide layer is thin, and can avoid occupying large space, thereby facilitating subsequent filling or formation of another structure layer. A material of the gate oxide layer 90 may include, but is not limited to, silicon dioxide, silicon monoxide, hafnium oxide, or titanium oxide.

According to an exemplary embodiment, this embodiment is a further description of step S500 described above.

In step S500, as shown in FIGS. 13 to 16, a gate dielectric layer 100 is formed on the gate oxide layer 90. Along the first direction X, the gate dielectric layer 100 is shorter than the gate oxide layer 90. The top surface of the gate dielectric layer 100 is flush with that of the third segment 603.

The gate dielectric layer 100 may be formed by using the following method.

Figure 12:
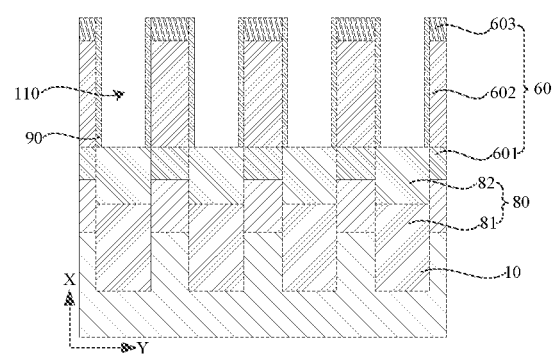
FIG. 12 is a schematic diagram of forming a gate oxide layer along the direction Y in the manufacturing method of a semiconductor structure according to an exemplary embodiment.

With reference to FIG. 12, after the gate oxide layer 90 is formed, a filling region 110 is formed between the top surface of the second isolation layer 82 and the sidewall of the gate oxide layer 90.

First, a first initial word line (not shown in the figure) is formed in the filling region 110 by using the atomic layer deposition process, the physical vapor deposition process, or the chemical vapor deposition process.

Figure 13:
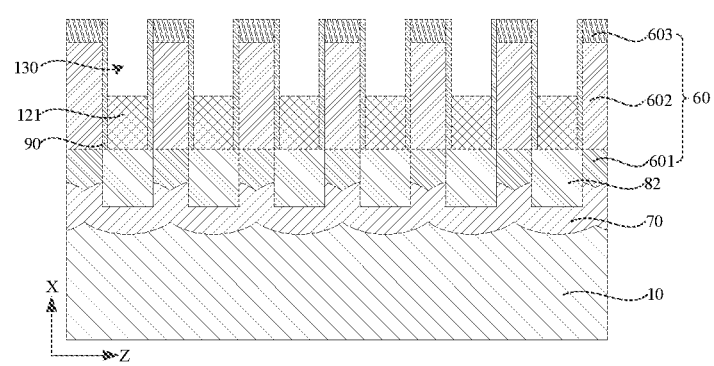
FIG. 13 is a schematic diagram of forming a first word line along the direction Z in the manufacturing method of a semiconductor structure according to an exemplary embodiment.
Figure 14:
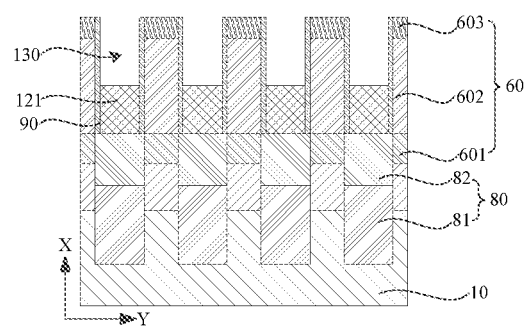
FIG. 14 is a schematic diagram of forming the first word line along the direction Y in the manufacturing method of a semiconductor structure according to an exemplary embodiment.

Then, with reference to FIGS. 13 and 14, along the first direction X, the first initial word line is partially removed through etching. The etching endpoint of the first initial word line is flush with a preset position of the second segment 602. The retained first initial word line forms a first word line 121. In this step, the preset position of the second segment 602 may be one-third to two-thirds of a height of the second segment along the first direction X. In an example, the preset position of the second segment is at half a height of the second segment, that is, the top surface of the first word line 121 is flush with half a height of the second segment 602 along the first direction X. A first trench 130 is formed between the first word line 121 and the gate oxide layer 90 adjacent thereto. A material of the first word line 121 may include but is not limited to, tungsten or polycrystalline silicon.

Then, the top surface of the gate oxide layer 90 is processed through chemical mechanical polishing to remove the gate oxide layer 90 on the top surface of the third segment 603 of the active pillar 60.

Figure 15:
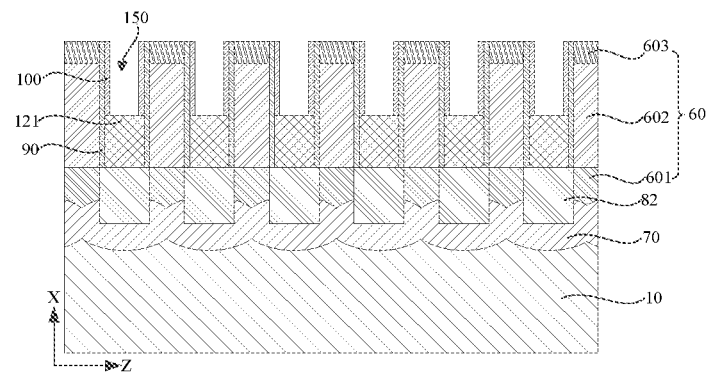
FIG. 15 is a schematic diagram of forming a gate dielectric layer along the direction Z in the manufacturing method of a semiconductor structure according to an exemplary embodiment.
Figure 16:
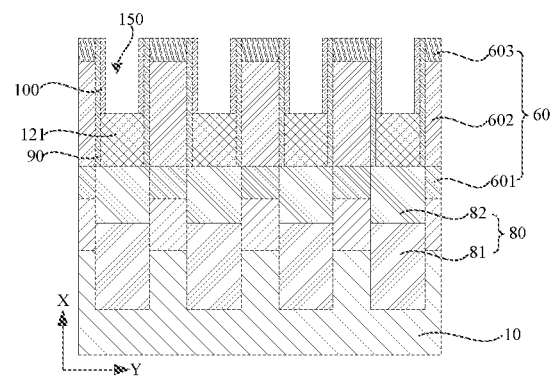
FIG. 16 is a schematic diagram of forming the gate dielectric layer along the direction Y in the manufacturing method of a semiconductor structure according to an exemplary embodiment.

Finally, with reference to FIGS. 15 and 16, a gate dielectric layer 100 is formed on the sidewall of the first trench 130. In the process of forming the gate dielectric layer 100, an initial gate dielectric layer (not shown in the figure) may be formed in the first trench 130 by using the atomic layer deposition process. The initial gate dielectric layer covers the sidewall of the gate oxide layer 90, the top surface of the third segment 603, and the top surface of the first word line 121. Then, the initial gate dielectric layer on the top surface of the third segment 603 and the top surface of the first word line 121 is removed through etching, and the initial gate dielectric layer on the sidewall of the first trench 130 is retained. The retained initial gate dielectric layer forms the gate dielectric layer 100. The bottom surface of the gate dielectric layer 100 is connected to the first word line 121. The top surface of the gate dielectric layer 100 is flush with that of the third segment 603.

The material of the gate dielectric layer 100 may include, but is not limited to, a dielectric material or a high-K material. The gate oxide layer 90 made of the dielectric material or the high-K material is beneficial to improving the capacitance of the subsequently formed capacitor. It should be noted that the dielectric material may be formed by a high-k dielectric material such as silicon nitride, or the dielectric material may include, but is not limited to, tantalum oxide, niobium oxide, titanium oxide, barium oxide, strontium oxide, lanthanum oxide, praseodymium oxide, or barium strontium titanate. The high-K material includes, but is not limited to, zirconium oxide, hafnium oxide, titanium zirconium oxide, ruthenium oxide, or aluminum oxide.

Because the first word line 121 is formed in the filling region 110 before the gate dielectric layer 100 is formed, the first word line 121 shields a part of the second segment 602, such that the gate dielectric layer 100 is shorter than the gate oxide layer 90 in the first direction X.

In the related art, a GIDL current exists in a GAA transistor. The reason for this kind of transistor to generate the GIDL current is that a thickness of a gate oxide layer is small, which reduces a charge storage capability of the gate oxide layer. When the GAA transistor is in a static state, electrons generated by a gate or a small quantity of carrier fluids enter a drain of the transistor through the gate oxide layer, which causes a high electric field effect to the drain of the transistor, resulting in a leakage current at the drain. In this embodiment, the gate oxide layer 90 is formed on the sidewalls of each of the second segment 602 and the third segment 603 of the active pillar 60, and then the gate dielectric layer 100 is formed on the sidewall of the gate oxide layer 90. The gate dielectric layer 100 is formed by a dielectric material or a high-K material, which can effectively improve the capacitance of subsequent capacitors and prevent the electrons generated by the gate in the semiconductor structure or the small quantity of carrier fluids from entering the source or the drain through the gate oxide layer 90, thereby effectively reducing the GIDL current, and improving the performance and the yield of the semiconductor structure.

As shown in FIGS. 15 to 22, in some embodiments, to insulate adjacent word lines 120 formed subsequently, word line isolation structures 140 are formed in the substrate 10.

In some embodiments, the word line isolation structure 140 may be formed by using the following method.

With reference to FIGS. 15 and 16, after the gate dielectric layer 100 is formed, a second trench 150 is formed between the top surface of the first word line 121 and the sidewall of the gate dielectric layer 100.

First, a second initial word line (not shown in the figure) is formed in the second trench 150 by using the atomic layer deposition process, the physical vapor deposition process, or the chemical vapor deposition process. A plurality of second initial word lines fill up the second trenches 150, and are disposed at intervals along the third direction Z.

Figure 17:
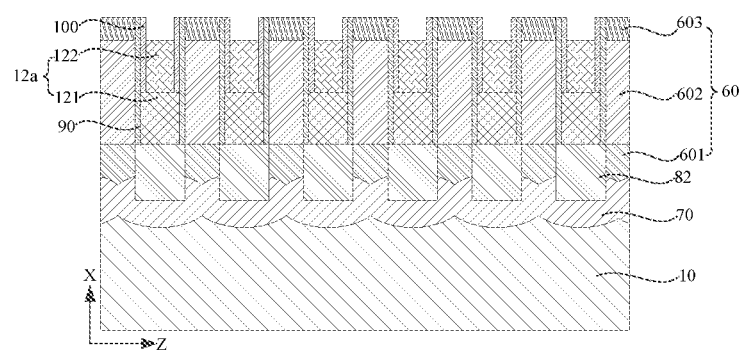
FIG. 17 is a schematic diagram of forming an initial word line structure along the direction Z in the manufacturing method of a semiconductor structure according to an exemplary embodiment.
Figure 18:
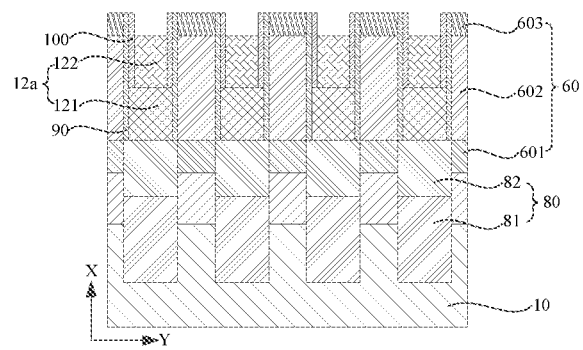
FIG. 18 is a schematic diagram of forming the initial word line structure along the direction Y in the manufacturing method of a semiconductor structure according to an exemplary embodiment.

With reference to FIGS. 17 and 18, along the first direction X, a part of the second initial word line is removed through etching. The etching endpoint of the second initial word line is flush with a junction between the second segment 602 and the third segment 603. The retained second initial word line forms a second word line 122. A material of the second word line 122 includes, but is not limited to, tungsten or polycrystalline silicon.

The second word line 122 and the first word line 121 form the initial word line structure 12a.

Figure 19:
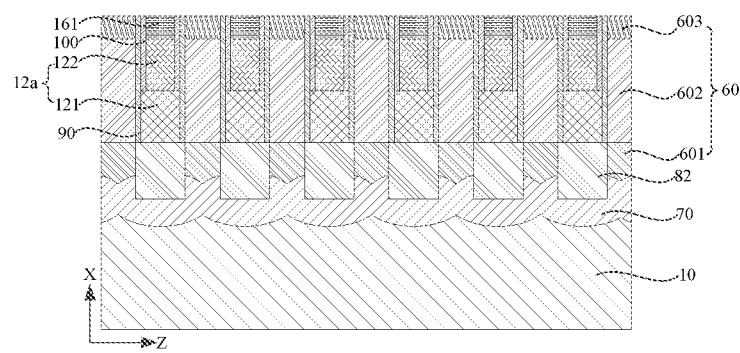
FIG. 19 is a schematic diagram of forming a third initial isolation layer along the direction Z in the manufacturing method of a semiconductor structure according to an exemplary embodiment.
Figure 20:
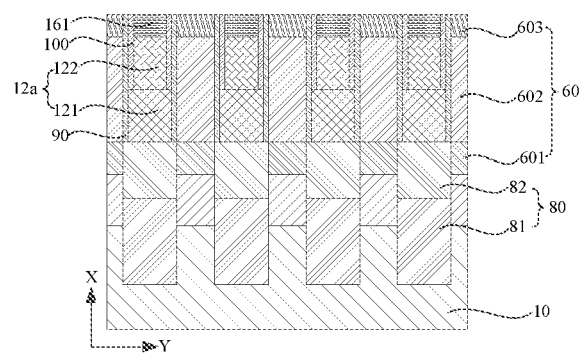
FIG. 20 is a schematic diagram of forming the third initial isolation layer along the direction Y in the manufacturing method of a semiconductor structure according to an exemplary embodiment.

With reference to FIGS. 19 and 20, a third initial isolation layer 161 is formed on the top surface of the initial word line structure 12a through the atomic layer deposition process, the physical vapor deposition process, or the chemical vapor deposition process. The top surface of the third initial isolation layer 161 is flush with that of the active pillar 60.

Figure 21:
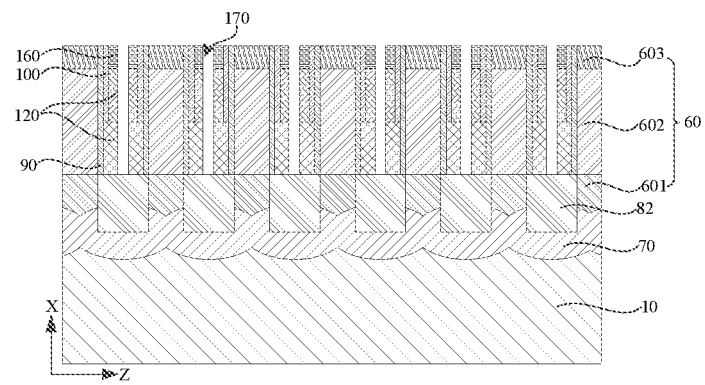
FIG. 21 is a schematic diagram of forming a word line along the direction Z in the manufacturing method of a semiconductor structure according to an exemplary embodiment.

With reference to FIG. 21, along the first direction X, the third initial isolation layer 161 and the initial word line structure 12a are partially removed through etching, thereby forming a plurality of third trenches 170 in the substrate 10. The bottom of the third trench 170 exposes the top surface of the second isolation layer 82. The plurality of third trenches 170 are arranged at intervals along the third direction Z, and the plurality of third trenches 170 correspond to the plurality of initial word line structures 12a.

Figure 22:
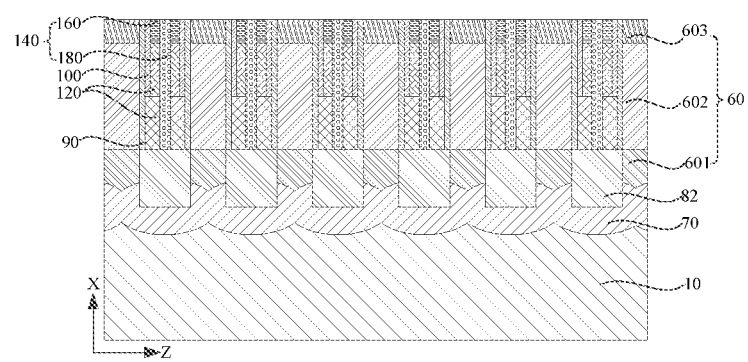
FIG. 22 is a schematic diagram of forming a word line isolation structure along the direction Z in the manufacturing method of a semiconductor structure according to an exemplary embodiment.

Finally, with reference to FIG. 22, a fourth isolation layer 180 is formed in the third trench 170 through the atomic layer deposition process, the physical vapor deposition process, or the chemical vapor deposition process. The top surface of the fourth isolation layer 180 is flush with that of the active pillar 60.

After the fourth isolation layer 180 is formed, the fourth isolation layer 180 divides the initial word line structure 12a in the word line isolation trench 50 into two word lines 120. The retained third initial isolation layer 161 forms the third isolation layer 160. The third isolation layer 160 and the fourth isolation layer 180 form the word line isolation structure 140. A material of the third isolation layer 160 may include, but is not limited to, silicon nitride, silicon dioxide, or silicon oxynitride. A material of the fourth isolation layer 180 includes a nitride, an oxide, a high-k dielectric material, or another suitable insulating material.

In the related art, a gate structure with dual work functions is generally obtained by depositing word line metal layers of different materials at the gate. In addition, a process required for depositing the metal layers of different materials is relatively complex, and an isolation layer is required between the metal layers of different materials due to a diffusion problem.

In this embodiment, the word line 120 is formed by metal tungsten or polysilicon through two depositions, such that a thickness of the word line does not affect the potential of the word line 120. In this case, the gate oxide layer 90 is formed on the sidewalls of each of the second segment 602 and the third segment 603, and then the gate dielectric layer 100 is formed on the first gate oxide layer 90 on the sidewall corresponding to the second sub-segment of the second segment 602 and on the sidewall corresponding to the third segment 603, such that charge storage capacities at different positions of the second segment 602 are different, and the charge storage capacities of parts of the third segment 603 and of the second segment 602 connected to the third segment 603 are each greater than that of a part of the second segment 602 connected to the first segment 601, thereby forming a gate structure of which a function conforms to the dual work function. Therefore, the processing process is simple and easy to control and perform.

Therefore, when the transistor formed by the semiconductor structure in this embodiment, such as the GAA transistor, is used, the charge storage capacity of the channel region close to the source increases. To turn on the transistor, an additional turn-on voltage VT of the terminal increases, which correspondingly increases a potential of a part of the word line 120 close to the third segment 603, thereby forming a potential difference between the word lines 120 at two ends of the second segment 602.

Further, when the additional turn-on voltage VT of the source terminal increases, a source voltage Vs of the source terminal increases. A relationship shown in the following formula exists between the turn-off current (I off) and the source voltage Vs, namely:

$$I\ \text{off} \propto e^{-(Vs*\varepsilon/kt)}$$

In the above formula, ε/kt represents a constant, which is about 0.0256. Therefore, when the source voltage Vs of the source terminal increases, the turn-off current (I off) decreases. Because the turn-off current and the source voltage Vs meet an exponential relationship of e, when the thickness of the gate oxide layer of the source terminal of the transistor increases, the turn-off current decreases exponentially, so as to facilitate the control of the turn-off current of the semiconductor structure, thereby reducing the GIDL current and inter-band tunneling of the semiconductor structure, and improving the performance and the yield of the semiconductor structure.

As shown in FIGS. 23 to 34, in some other embodiments, the gate dielectric layer 100 may be formed by using the following method.

After the gate oxide layer 90 in the foregoing embodiment is formed, a filling region 110 is formed between the top surface of the second isolation layer 82 and the sidewall of the gate oxide layer 90.

Figure 23:
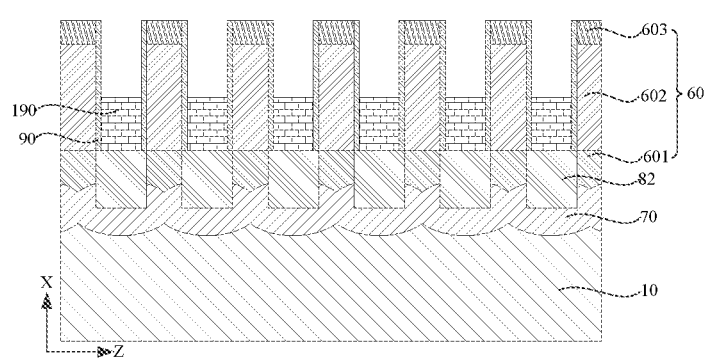
FIG. 23 is a schematic diagram of forming a sacrificial layer along the direction Z in the manufacturing method of a semiconductor structure according to an exemplary embodiment.
Figure 24:
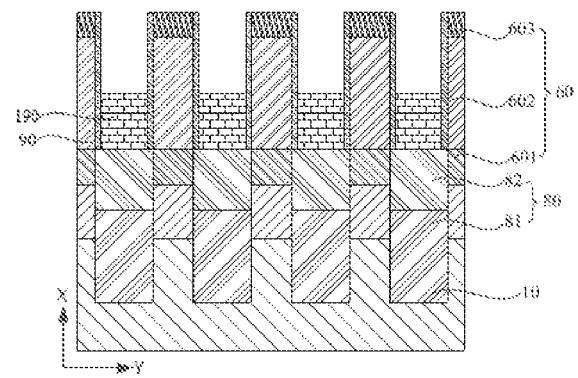
FIG. 24 is a schematic diagram of forming the sacrificial layer along the direction Y in the manufacturing method of a semiconductor structure according to an exemplary embodiment.

As shown in FIGS. 23 and 24, the sacrificial layer 190 is formed in the filling region 110 by using the atomic layer deposition process, the physical vapor deposition process, or the chemical vapor deposition process. In some embodiments, an initial sacrificial layer (not shown in the figure) may be formed in the filling region 110 first, and the initial sacrificial layer fills up the filling region 110. After that, a part of the initial sacrificial layer is removed through etching, where an etching endpoint of the initial sacrificial layer is flush with a preset position of the second segment 602. The retained initial sacrificial layer forms a sacrificial layer 190. A material of the sacrificial layer 190 may include but is not limited to a nitride or oxynitride.

It should be noted that, the preset position of the second segment 602 in this embodiment may be one-third to two-thirds of its height. In an embodiment, the preset position of the second segment 602 is at half of the height of the second segment 602. That is, the top surface of the sacrificial layer 190 is flush with half a height of the second segment 602 along the first direction X.

The top surface of the gate oxide layer 90 is processed through chemical mechanical polishing to remove the gate oxide layer 90 on the top surface of the third segment 603 of the active pillar 60.

Figure 25:
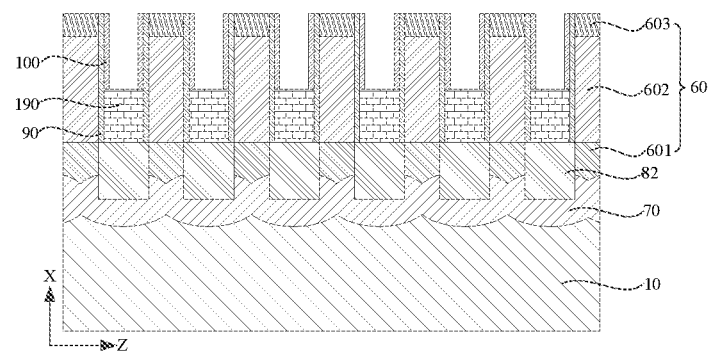
FIG. 25 is a schematic diagram of forming a gate dielectric layer along the direction Z in the manufacturing method of a semiconductor structure according to an exemplary embodiment.
Figure 26:
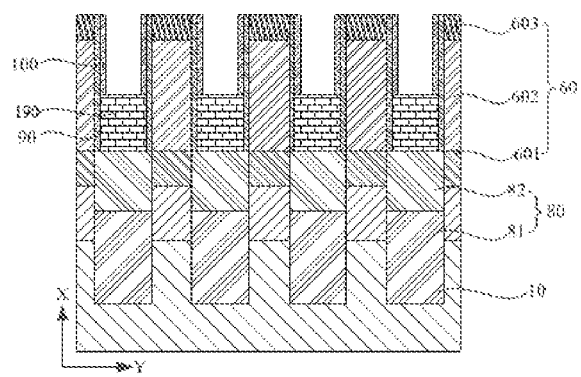
FIG. 26 is a schematic diagram of forming the gate dielectric layer along the direction Y in the manufacturing method of a semiconductor structure according to an exemplary embodiment.

Finally, with reference to FIGS. 25 and 26, a gate dielectric layer 100 is formed on the sidewall of the gate oxide layer 90. In the process of forming the gate dielectric layer 100, an initial gate dielectric layer (not shown in the figure) may be formed in the first trench 130 by using the atomic layer deposition process. The initial gate dielectric layer covers the sidewall of the gate oxide layer 90, the top surface of the third segment 603, and the top surface of the sacrificial layer 190. Then, the initial gate dielectric layer on the top surface of the third segment 603 and the top surface of the sacrificial layer 190 is removed through etching, and the initial gate dielectric layer on the sidewall of the gate oxide layer 90 is retained. The retained initial gate dielectric layer forms the gate dielectric layer 100, the bottom surface of the gate dielectric layer 100 is connected to the sacrificial layer 190, and the top surface of the gate dielectric layer 100 is flush with that of the third segment 603, such that two ends of the second segment 602 have different capacitances, to have different potentials, which is beneficial to controlling the turn-off current of the semiconductor structure, and reducing the problems of GIDL current and inter-band tunneling, thereby improving the performance and yield of the semiconductor structure.

Figure 27:
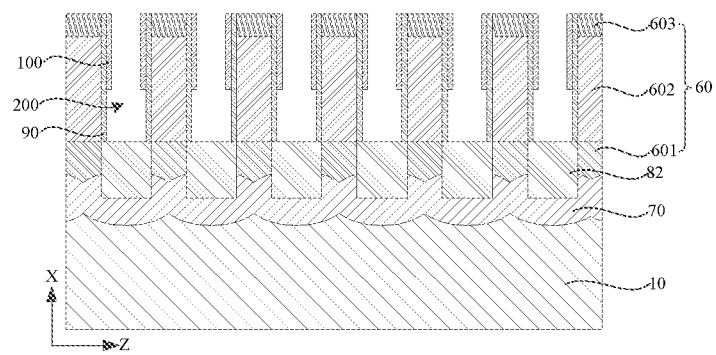
FIG. 27 is a schematic diagram of forming a fourth trench along the direction Z in the manufacturing method of a semiconductor structure according to an exemplary embodiment.
Figure 28:
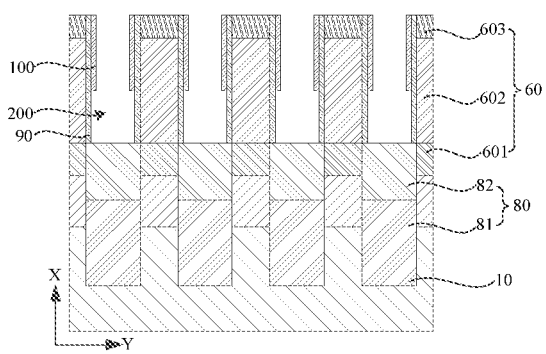
FIG. 28 is a schematic diagram of forming the fourth trench along the direction Y in the manufacturing method of a semiconductor structure according to an exemplary embodiment.

Then, with reference to FIGS. 27 and 28, the sacrificial layer 190 is removed through etching along the first direction X. A fourth trench 200 is formed between the sidewall of the gate dielectric layer 100 and the sidewall of the gate oxide layer 90 originally covered by the sacrificial layer 190.

Then, the word line isolation structure 140 is formed in the fourth trench 200. A plurality of word line isolation structures 140 are provided and arranged at intervals along the third direction Z.

In some embodiments, the word line isolation structure 140 may be formed by using the following method.

Figure 29:
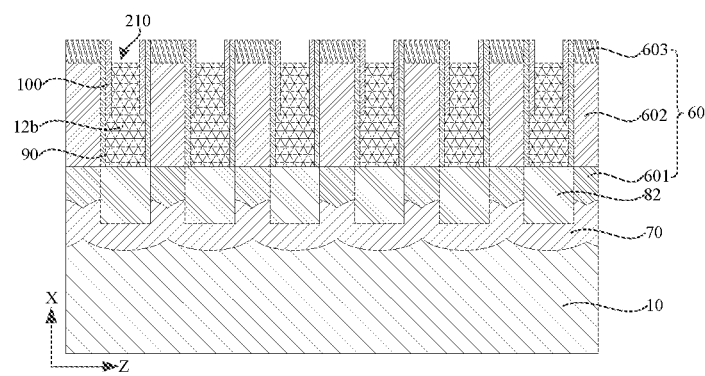
FIG. 29 is a schematic diagram of forming an intermediate word line along the direction Z in the manufacturing method of a semiconductor structure according to an exemplary embodiment.
Figure 30:
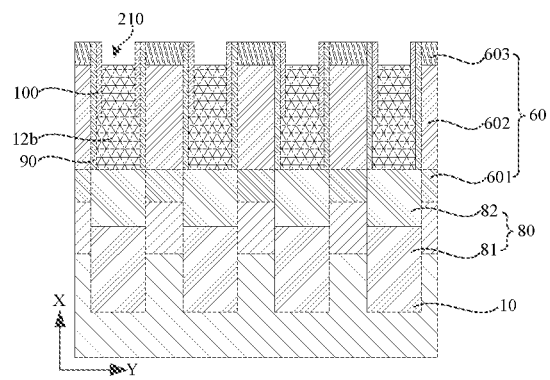
FIG. 30 is a schematic diagram of forming the intermediate word line along the direction Y in the manufacturing method of a semiconductor structure according to an exemplary embodiment.

With reference to FIGS. 29 and 30, an initial word line (not shown in the figure) is formed in the fourth trench 200 by using the atomic layer deposition process, the physical vapor deposition process, or the chemical vapor deposition process. The plurality of initial word lines are disposed at intervals along the third direction Z.

Then, along the first direction X, a part of the initial word line is removed through etching, and the retained initial word line forms an intermediate word line 12b. It should be noted that an etching endpoint of the initial word line is flush with a junction between the second segment 602 and the third segment 603. A fifth trench 210 is formed between the intermediate word line 12b and the sidewall of the gate dielectric layer 100.

Figure 31:
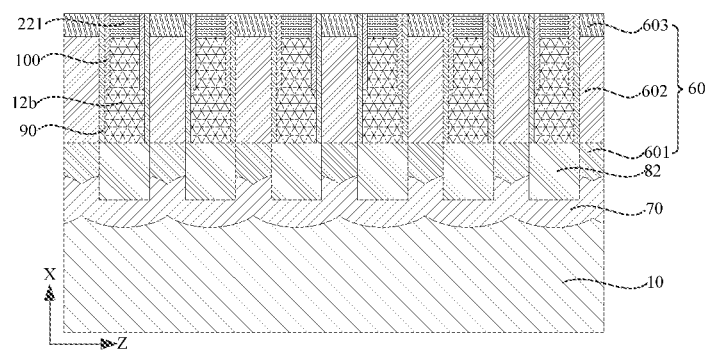
FIG. 31 is a schematic diagram of forming a fifth initial isolation layer along the direction Z in the manufacturing method of a semiconductor structure according to an exemplary embodiment.
Figure 32:
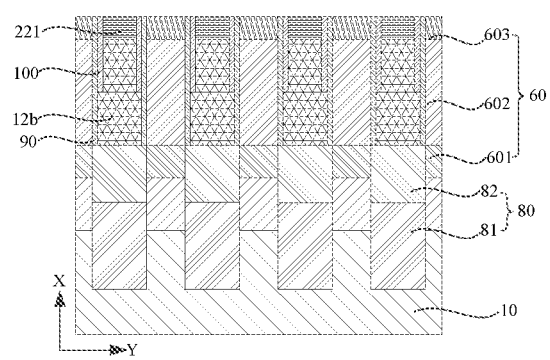
FIG. 32 is a schematic diagram of forming the fifth initial isolation layer along the direction Y in the manufacturing method of a semiconductor structure according to an exemplary embodiment.

Then, with reference to FIGS. 31 and 32, a fifth initial isolation layer 221 is formed in the fifth trench 210 by using the atomic layer deposition process, the physical vapor deposition process, or the chemical vapor deposition process. It should be noted that, in an embodiment, the fifth initial isolation layer 221 may be the same as the third initial isolation layer 161 in the foregoing embodiment.

Figure 33:
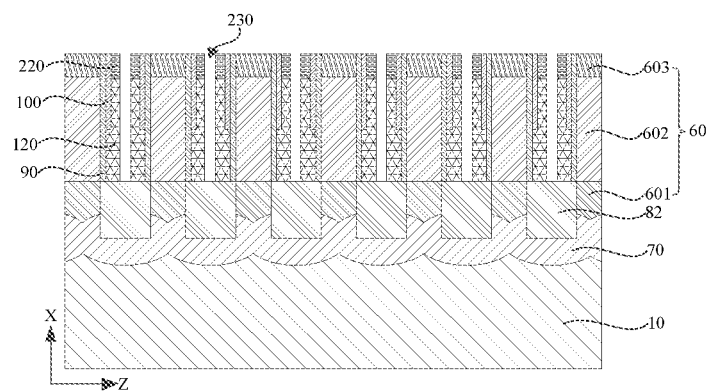
FIG. 33 is a schematic diagram of forming a fifth isolation layer, a sixth trench, and a word line along the direction Z in the manufacturing method of a semiconductor structure according to an exemplary embodiment.

With reference to FIG. 33, the fifth initial isolation layers 221 and the intermediate word lines 12b are partially removed through etching along the first direction X to form a plurality of sixth trenches 230 disposed at intervals along the third direction Z. The bottom of the sixth trench 230 exposes the top surface of the second isolation layer 82. The retained fifth initial isolation layer 221 forms a fifth isolation layer 220. The retained intermediate word line 12b forms two word lines 120.

Figure 34:
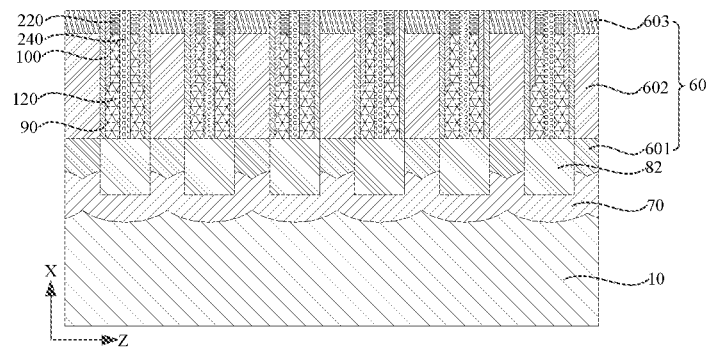
FIG. 34 is a schematic diagram of forming a sixth isolation layer along the direction Z in the manufacturing method of a semiconductor structure according to an exemplary embodiment.

Finally, with reference to FIG. 34, a sixth isolation layer 240 is formed in the sixth trench 230 by using the atomic layer deposition process, the physical vapor deposition process, or the chemical vapor deposition process. The sixth isolation layer 240 and the fifth isolation layer 220 form the word line isolation structure 140. A material of the sixth isolation layer 240 includes a nitride, an oxide, a high-k dielectric material, or another suitable insulating material.

In this embodiment, the word line 120 is formed once through a deposition process, which is simple and convenient to control the formation quality of the word line 120. A material of the word line 120 may include but is not limited to, metal tungsten or polycrystalline silicon.

As shown in FIGS. 20 and 22, an exemplary embodiment of the present disclosure provides a semiconductor structure. The semiconductor structure includes a substrate 10, an active pillar 60, a gate oxide layer 90, and a gate dielectric layer 100.

A plurality of active pillars 60 are provided and are arranged in an array in the substrate 10. Along a first direction X, the active pillar 60 includes a first segment 601, a second segment 602, and a third segment 603 that are connected sequentially. The first segment 601 is connected to the substrate 10. The first segment 601 may form the drain of the active pillar 60. The second segment 602 may form the channel region. The third segment 603 may form the source.

The gate oxide layer 90 is disposed on sidewalls of each of the second segment 602 and the third segment 603.

The gate dielectric layer 100 is disposed outside the gate oxide layer 90. Along the first direction X, the gate dielectric layer 100 is shorter than the gate oxide layer 90. The top surface of the gate dielectric layer 100 is flush with that of the third segment 603.

In this embodiment, the gate oxide layer is formed on the sidewalls of each of the second segment and the third segment of the active pillar, and then the gate dielectric layer is formed on the sidewall of the gate oxide layer. The gate dielectric layer is shorter than the gate oxide layer, and the top surface of the gate dielectric layer is flush with that of the third segment, such that two ends of the second segment have different capacitances, to have different potentials, which is beneficial to controlling the turn-off current of the semiconductor structure, and reducing the problems of GIDL current and inter-band tunneling, thereby improving the performance and yield of the semiconductor structure.

As shown in FIGS. 20 and 22, in some embodiments, the semiconductor structure further includes a plurality of bit lines 70. The plurality of bit lines 70 are disposed at intervals along the second direction Y. The bit lines 70 are located below the active pillars 60, and are configured to connect the first segments 601 of the plurality of active pillars 60, along the third direction Z, on a same line.

As shown in FIG. 20, in some embodiments, the semiconductor structure further includes a plurality of bit line isolation structures 80. The plurality of bit line isolation structures 80 are disposed at intervals along the second direction Y. The bit line isolation structure 80 includes a first isolation layer 81 and a second isolation layer 82. The first isolation layer 81 is located between adjacent bit lines 70, the second isolation layer 82 is disposed on the first isolation layer 81, and the top surface of the second isolation layer 82 is flush with a junction between the second segment 602 and the first segment 601. The bit line isolation structure 80 is configured to insulate adjacent bit lines 70.

As shown in FIGS. 20, 22, and 34, in some embodiments, the semiconductor structure further includes word lines 120. The word line 120 surrounds the second segment 602 of the active pillar 60, such that a GAA transistor structure can be formed. The word line 120 includes a first word line structure and a second line structure. A bottom surface of the first word line structure is close to the first segment 601, and a top surface of the second word line structure is close to the third segment 603. Taking a plane perpendicular to a second direction Y as a longitudinal section, a longitudinal cross-sectional area of the first word line structure is greater than that of the second word line structure.

It should be noted that, in an embodiment, the first word line structure and the second word line structure may be formed through one deposition or two depositions. In this case, the longitudinal cross-sectional area of the first word line structure is greater than that of the second word line structure, such that different capacities of stored charges are formed at both ends of the second segment 602.

As shown in FIG. 22, in some embodiments, the semiconductor structure further includes a plurality of word line isolation structures 140. The word line isolation structure 140 is configured to insulate adjacent word lines 120. The word line isolation structure 140 includes a third isolation layer 160 and a fourth isolation layer 180. The third isolation layer 160 is located on the top surface of the second word line structure, and the fourth isolation layer 180 is located between adjacent word lines 120.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

The invention claimed is:

1. A manufacturing method of a semiconductor structure, comprising:
   providing a substrate;
   forming a plurality of silicon pillars on the substrate, wherein the plurality of silicon pillars are arranged as an array;
   pre-processing the silicon pillar to form an active pillar, wherein along a first direction, the active pillar comprises a first segment, a second segment, and a third segment that are connected sequentially;
   forming a gate oxide layer on sidewalls of each of the second segment and the third segment; and
   forming a gate dielectric layer on the gate oxide layer, wherein along the first direction, the gate dielectric layer is shorter than the gate oxide layer, and a top surface of the gate dielectric layer is flush with that of the third segment;
   wherein the forming a plurality of silicon pillars on the substrate comprises:
   forming a plurality of bit line isolation trenches in the substrate, wherein the plurality of bit line isolation trenches are arranged at intervals along a second direction, and the substrate between adjacent two of the bit line isolation trenches forms a strip body; and
   forming a plurality of word line isolation trenches in the substrate, wherein the plurality of word line isolation trenches are arranged at intervals along a third direction to divide the strip body into the plurality of silicon pillars, and along the first direction, the word line isolation trench is shallower than the bit line isolation trench.

2. The manufacturing method of a semiconductor structure according to claim 1, wherein the pre-processing the silicon pillar to form an active pillar comprises:
   oxidizing the silicon pillar, wherein a plane perpendicular to the first direction is used as a cross section, and a cross-sectional shape of the active pillar comprises a circle.

3. The manufacturing method of a semiconductor structure according to claim 1, the manufacturing method further comprises:
   forming a first isolation layer in the bit line isolation trench, wherein a top surface of the first isolation layer is flush with a bottom surface of the word line isolation trench; and
   implanting ions into the word line isolation trenches, to form a plurality of bit lines at bottom surfaces of the first segments, wherein the plurality of bit lines are arranged at intervals along the second direction.

4. The manufacturing method of a semiconductor structure according to claim 3, the manufacturing method further comprises:
   forming a plurality of bit line isolation structures in the substrate, wherein the plurality of bit line isolation structures are arranged at intervals along the second direction.

5. The manufacturing method of a semiconductor structure according to claim 4, wherein the forming a plurality of bit line isolation structures in the substrate comprises:
   forming a second initial isolation layer on the top surface of the first isolation layer and in the word line isolation trench; and
   partially removing the second initial isolation layer along the first direction, wherein the retained second initial isolation layer forms a second isolation layer; and
   along the first direction, the first isolation layer and the second isolation layer in the bit line isolation trench form the bit line isolation structure, and a top surface of the second isolation layer is flush with a junction between the first segment and the second segment.

6. The manufacturing method of a semiconductor structure according to claim 5, wherein the forming a gate oxide layer on sidewalls of each of the second segment and the third segment comprises:
   forming an initial gate oxide layer on the active pillar by an atomic layer deposition process, wherein the initial gate oxide layer covers the sidewall of the second segment, and the sidewall and the top surface of the third segment; and
   partially removing the initial gate oxide layer, to expose the top surface of the second isolation layer, wherein the retained initial gate oxide layer forms the gate oxide layer.

7. The manufacturing method of a semiconductor structure according to claim 6, wherein a filling region is formed between the top surface of the second isolation layer and a sidewall of the gate oxide layer; and
   the forming a gate dielectric layer on the gate oxide layer comprises:

forming a first initial word line in the filling region;

partially removing the first initial word line, wherein the retained first initial word line forms a first word line, a top surface of the first word line is flush with a preset position of the second segment, and a first trench is formed between the first word line and the gate oxide layer adjacent thereto;

removing the gate oxide layer on the top surface of the third segment; and forming the gate dielectric layer on a sidewall of the first trench.

8. The manufacturing method of a semiconductor structure according to claim 7, wherein a second trench is formed between the top surface of the first word line and a sidewall of the gate dielectric layer; and the manufacturing method of a semiconductor structure further comprises:

forming a second initial word line in the second trench; and partially removing the second initial word line, wherein the retained second initial word line forms a second word line, a top surface of the second word line is flush with a junction between the second segment and the third segment, and the first word line and the second word line form an initial word line structure.

9. The manufacturing method of a semiconductor structure according to claim 8, the manufacturing method further comprises:

forming a third initial isolation layer on the initial word line structure;

partially removing the third initial isolation layers and the initial word line structures, to form a plurality of third trenches arranged at intervals along the third direction on the substrate, wherein a bottom of the third trench exposes the second isolation layer, and the plurality of third trenches correspond to the plurality of initial word line structures one by one; and forming a fourth isolation layer in the third trench, wherein the retained initial word line structure forms two word lines, the retained third initial isolation layer forms a third isolation layer, and the third isolation layer and the fourth isolation layer form a word line isolation structure.

10. The manufacturing method of a semiconductor structure according to claim 6, wherein a filling region is formed between the top surface of the second isolation layer and a sidewall of the gate oxide layer; and the forming a gate dielectric layer on the gate oxide layer comprises:

forming a sacrificial layer in the filling region, wherein a top surface of the sacrificial layer is flush with a preset position of the second segment;

partially removing the gate oxide layer, to expose a top surface of the active pillar;

forming the gate dielectric layer, wherein a bottom surface of the gate dielectric layer is connected to the top surface of the sacrificial layer, and the gate dielectric layer is located outside the gate oxide layer partially covering the sidewalls of each of the second segment and the third segment; and removing the sacrificial layer, wherein a sidewall of the gate dielectric layer and the sidewall of the gate oxide layer originally covered by the sacrificial layer form a fourth trench.

11. The manufacturing method of a semiconductor structure according to claim 10, the manufacturing method further comprises:

forming a plurality of word line isolation structures in the fourth trenches, wherein the plurality of word line isolation structures are arranged at intervals along the third direction.

12. The manufacturing method of a semiconductor structure according to claim 11, wherein the forming a plurality of word line isolation structures in the fourth trenches comprises:

forming a plurality of initial word lines in the fourth trenches, wherein the plurality of initial word lines are arranged at intervals along the third direction;

partially removing the initial word line along the first direction, wherein the retained initial word line forms an intermediate word line, and a fifth trench is formed between the intermediate word line and the sidewall of the gate dielectric layer;

forming a fifth initial isolation layer in the fifth trench;

partially removing the fifth initial isolation layers and the intermediate word lines along the first direction, to form a plurality of sixth trenches arranged at intervals along the third direction, wherein a bottom of the sixth trench exposes the top surface of the second isolation layer, the retained fifth initial isolation layer forms a fifth isolation layer, and the retained intermediate word line forms two word lines; and forming a sixth isolation layer in the sixth trench, wherein the sixth isolation layer and the fifth isolation layer form the word line isolation structure.

* * * * *